(12) United States Patent
Nagel et al.

(10) Patent No.: US 9,543,471 B2
(45) Date of Patent: Jan. 10, 2017

(54) OPTOELECTRONIC COMPONENT AND METHOD FOR THE PRODUCTION THEREOF

(71) Applicant: OSRAM OPTO SEMICONDUCTORS GMBH, Regensburg (DE)

(72) Inventors: Peter Nagel, Regensburg (DE); Stefan Illek, Donaustauf (DE); Martin Strassburg, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/889,316

(22) PCT Filed: May 12, 2014

(86) PCT No.: PCT/EP2014/059643
§ 371 (c)(1),
(2) Date: Nov. 5, 2015

(87) PCT Pub. No.: WO2014/184136
PCT Pub. Date: Nov. 20, 2014

(65) Prior Publication Data
US 2016/0111594 A1    Apr. 21, 2016

(30) Foreign Application Priority Data
May 14, 2013    (DE) .......................... 10 2013 104 954

(51) Int. Cl.
*H01L 33/00* (2010.01)
*H01L 33/06* (2010.01)
(Continued)

(52) U.S. Cl.
CPC ............. *H01L 33/10* (2013.01); *H01L 33/005* (2013.01); *H01L 33/04* (2013.01); *H01L 33/06* (2013.01); *H01L 33/08* (2013.01)

(58) Field of Classification Search
None
See application file for complete search history.

(56) References Cited

U.S. PATENT DOCUMENTS 6,535,541 B1    3/2003    Boucart et al.
9,130,353 B2 *  9/2015    Lell ....................... H01S 5/4043
(Continued)

FOREIGN PATENT DOCUMENTS

DE    199 52 932       5/2001
DE    102006039369    7/2007
(Continued)

OTHER PUBLICATIONS

Jain, F., et. al.,, "Resonant tunneling structures to significantly reduce the voltage drop in contacting pZnSe layer in blue-green lasers: simulation of voltage-current behavior" SPIE vol. 2346 II-VI Blue/Green Laser Diodes, pp. 170-179 (1994).*
(Continued)

*Primary Examiner* — Joseph Schoenholtz
(74) *Attorney, Agent, or Firm* — Cozen O'Connor

(57) ABSTRACT

An optoelectronic device (10, 1010) having a semiconductor layer structure (100, 1100) comprising a first light-active layer (140) and a second light-active layer (240). A first tunnel junction (200) is formed between the first light-active layer (140) and the second light-active layer (240). A first Bragg reflector (160) is formed between the first light-active layer (140) and the first tunnel junction (200). A second Bragg reflector (260) is formed between the second light-active layer (240) and the first tunnel junction (200).

17 Claims, 2 Drawing Sheets

(51) Int. Cl.
*H01L 33/04* (2010.01)
*H01L 33/08* (2010.01)
*H01L 33/10* (2010.01)

(56) References Cited

U.S. PATENT DOCUMENTS

| | | | |
|---|---|---|---|
| 2005/0067627 A1* | 3/2005 | Shen | H01L 33/08 257/89 |
| 2008/0197289 A1* | 8/2008 | Muller | G01S 7/4814 250/370.01 |
| 2010/0098127 A1* | 4/2010 | Higuchi | H01S 5/18341 372/50.11 |
| 2011/0012088 A1* | 1/2011 | Strassburg | H01L 33/04 257/13 |
| 2011/0280269 A1* | 11/2011 | Chang-Hasnain | B82Y 20/00 372/50.1 |

FOREIGN PATENT DOCUMENTS

| | | |
|---|---|---|
| DE | 102007035687 | 2/2009 |
| DE | 102008013030 | 6/2009 |
| EP | 1 793 462 | 6/2007 |
| EP | 1 950 854 | 7/2008 |
| EP | 2 312 631 | 10/2010 |

OTHER PUBLICATIONS

Refractive Index of InGaAs Alloys, downloaded from URL<http://www.batop.com/information/n_AlGaAs.html> on Apr. 28, 2016.*

Tihanyi, P.L., et. al., "High Power AlGaAs-GaAs Visible Diode Lasers", IEEE Photonics Technology Letters, vol. 6, No. 7, pp. 775-777 Jul. 1994.*

Jain, F., S. Srinivasan, E. Heller, R. Lacomb, M. Gokhale, and W. Huang. "Monolithic Integration of Red, Blue, and Green Lasers for Smart Projection Displays." J. Soc. Inf. Display Journal of the Society for Information Display 5.3 (1997): 241.*

Jain, F. et al.: "Monolithic Integration of Red, Blue and Green Lasers for Smart Projection Displays", SID International Symposium Digest of Technical Papers, vol. 26, May 23, 1995, pp. 516-519.

* cited by examiner

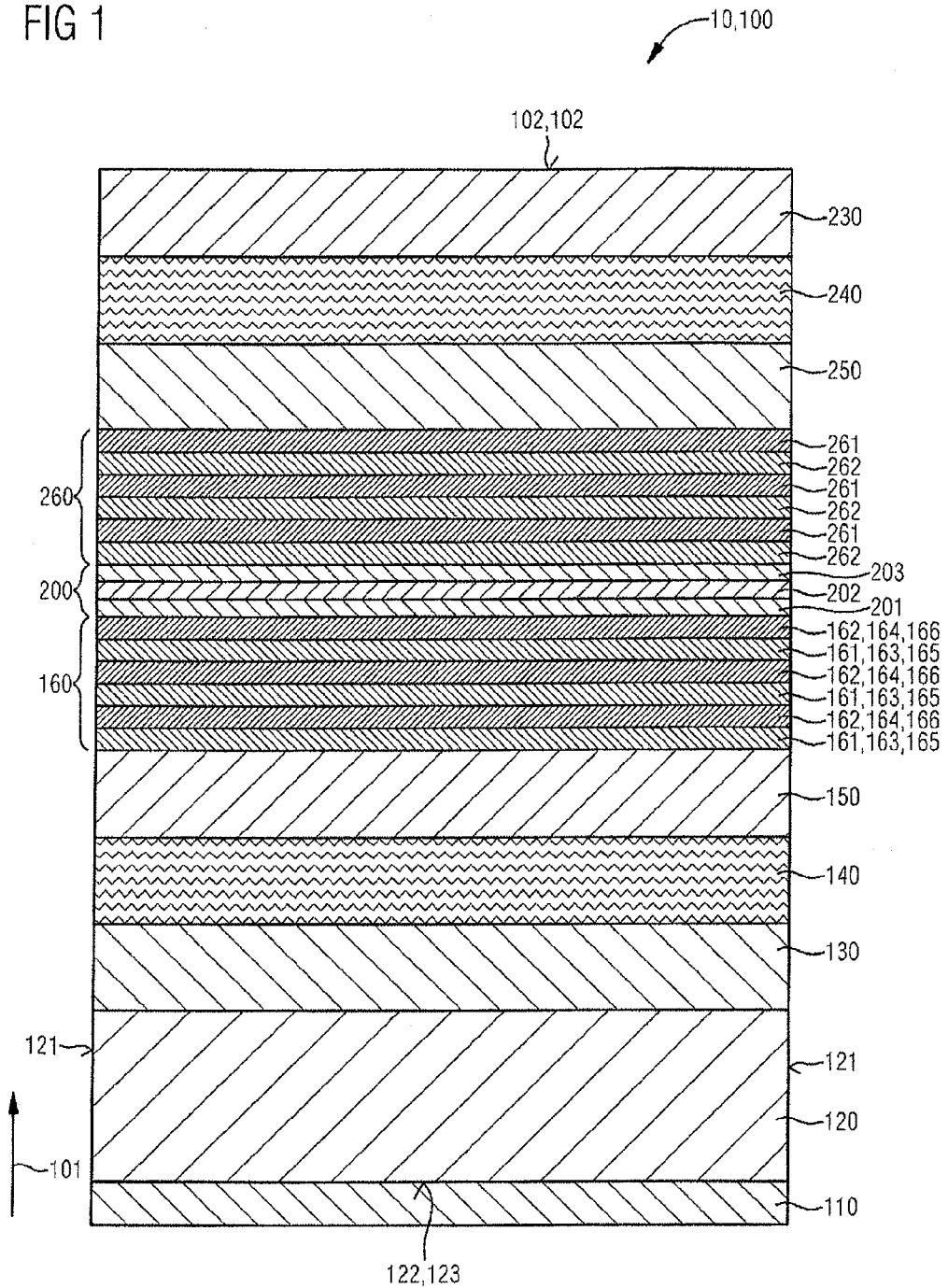

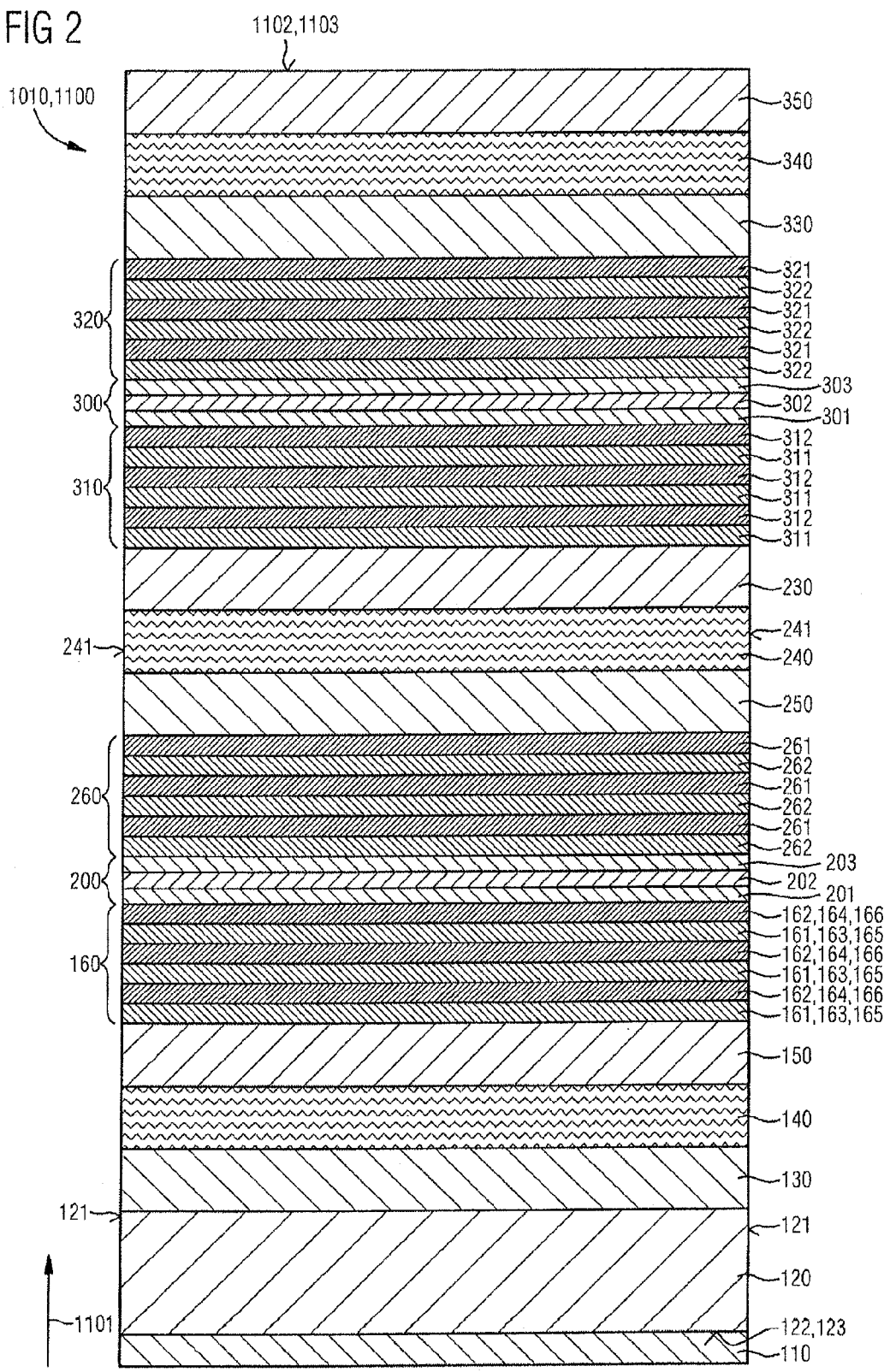

OPTOELECTRONIC COMPONENT AND METHOD FOR THE PRODUCTION THEREOF

RELATED APPLICATIONS

This is a U.S. National stage of International application No. PCT/EP2014/059643 filed on May 12, 2014.

This patent application claims the priority of German application no. 10 2013 104 954.0 filed May 14, 2013 the disclosure content of which is hereby incorporated by reference.

FIELD OF THE INVENTION

An optoelectronic device and a method for producing an optoelectronic device are provided.

SUMMARY OF THE INVENTION

One object of the present invention is to provide an improved optoelectronic device. A further object is to provide a method for producing an optoelectronic device.

It is possible to form optoelectronic devices from semiconductor layer structures which comprise light-active layers. The light-active layers may serve to emit for example infrared or visible electromagnetic radiation. In the case of optoelectronic devices emitting in the infrared spectral range, it is furthermore possible to stack two or even more light-active layers vertically on top of one another, separated by tunnel junctions, in the semiconductor layer structure and to connect them electrically in series.

In the case of optoelectronic devices with semiconductor layer structures consisting of material systems which are suitable for emitting light in the visible spectral range, however, layers which form the tunnel junction (designated hereinafter as tunnel junction for the sake of simplicity) between two such light-active layers arranged stacked on top of one another tend to absorb the emitted light, so reducing the brightness achievable by the optoelectronic device. The consequence of this is that optoelectronic devices with two stacked light-active layers may display up to 30% lower light emission than two separate optoelectronic devices.

According to at least one embodiment, the optoelectronic device comprises a semiconductor layer structure, which has a first light-active layer and a second light-active layer. In this case, a first tunnel junction is formed between the first light-active layer and the second light-active layer. In addition, a first Bragg reflector is formed between the first light-active layer and the first tunnel junction. Moreover, a second Bragg reflector is formed between the second light-active layer and the first tunnel junction. Advantageously, the Bragg reflectors of the semiconductor layer structure of this optoelectronic device reflect electromagnetic radiation which is emitted from the light-active layers of the semiconductor layer structure in the direction of the first tunnel junction. In this way, absorption of the electromagnetic radiation in the first tunnel junction and a resultant reduction in the brightness of the optoelectronic device is advantageously prevented. The electromagnetic radiation reflected by the Bragg reflector is not absorbed in the first tunnel junction, but rather may be emitted by the optoelectronic device or, without losing energy, be reabsorbed in the light-active layer.

In one embodiment of the optoelectronic device, the first Bragg reflector is configured to reflect electromagnetic radiation from the first light-active layer which impinges on the first Bragg reflector. Advantageously, electromagnetic radiation from the first light-active layer which impinges on the Bragg reflector cannot then be absorbed in the first tunnel junction of the semiconductor layer structure.

In one embodiment of the optoelectronic device, the first light-active layer is configured to emit electromagnetic radiation with a wavelength from a first wavelength interval. In this case, the first Bragg reflector is configured to reflect electromagnetic radiation with a wavelength from the first wavelength interval. Advantageously, the first Bragg reflector is thereby tuned to the wavelength of the electromagnetic radiation emitted by the first light-active layer, whereby the first Bragg reflector has a high reflectivity for this wavelength.

In one embodiment of the optoelectronic device the first Bragg reflector comprises a plurality of alternating first layers comprising a first material and second layers comprising a second material. Advantageously, some of the electromagnetic radiation may be reflected at each junction between a first layer and a second layer of the first Bragg reflector and at each junction between a second layer and a first layer of the Bragg reflector.

In one embodiment of the optoelectronic device, each pair of a first layer and an adjacent second layer together has an optical thickness which is at least as great as half a wavelength of electromagnetic radiation emitted by the first light-active layer. Advantageously, the fractions reflected at the layers of the first Bragg reflector of the electromagnetic radiation emitted by the first light-active layer may thereby interfere constructively, so resulting in a high reflectivity of the first Bragg reflector. Preferably, the first Bragg reflector even reflects with high reflectivity rays which do not impinge precisely perpendicularly on the first Bragg reflector.

In one embodiment of the optoelectronic device, the first material and the second material are group-III phosphides. Advantageously, the semiconductor layer structure of the optoelectronic device may in this case comprise a material system which is suitable for emitting visible electromagnetic radiation.

In another embodiment of the optoelectronic device, the first material and the second material are group-III nitrides. In this case, the semiconductor layer structure may advantageously also consist of a material system which is suitable for emitting visible electromagnetic radiation.

In one embodiment of the optoelectronic device, the first Bragg reflector is n-doped and the second Bragg reflector p-doped, or the first Bragg reflector is p-doped and the second Bragg reflector n-doped. Advantageously, the Bragg reflectors thereby serve at the same time to provide charge carriers for the adjacent light-active layers.

In one embodiment of the optoelectronic device, the second Bragg reflector is configured to reflect electromagnetic radiation from the second light-active layer which impinges on the second Bragg reflector. This advantageously prevents electromagnetic radiation emitted by the second light-active layer from being absorbed in the first tunnel junction of the semiconductor layer structure of the optoelectronic device.

In one embodiment of the optoelectronic device, the first tunnel junction comprises a p-doped region with a degree of doping of at least $10^{20}$ per cubic centimeter and an n-doped region with a degree of doping of at least $10^{20}$ per cubic centimeter. This advantageously makes it possible to configure the first tunnel junction with good electrical properties, whereby the optoelectronic device may display a high level of efficiency. In particular, the first tunnel junction may thereby have a high charge carrier concentration. One advantage of the optoelectronic device is that an increase in absorbency of the first tunnel junction associated with the favorable electrical properties of the first tunnel junction does not lead to a reduction in the brightness of the optoelectronic device, since electromagnetic radiation is already reflected at the Bragg reflectors before reaching the first tunnel junction.

In one embodiment of the optoelectronic device, a spacer layer is arranged between the p-doped region of the first tunnel junction and the n-doped region of the first tunnel junction. In this case, the spacer layer has a lower degree of doping than the p-doped region of the first tunnel junction and is preferably undoped. Advantageously, the spacer layer prevents diffusion of a p-dopant from the p-doped region of the first tunnel junction into the n-doped region of the first tunnel junction, which would result in neutralization of the n-doping. This ensures a high charge carrier density in the first tunnel junction.

In one embodiment of the optoelectronic device, the first light-active layer takes the form of a quantum film structure. Advantageously, high output powers may thereby be achieved with the optoelectronic device.

In one embodiment of the optoelectronic device, the semiconductor layer structure comprises a third light-active layer. In this case, a second tunnel junction is arranged between the second light-active layer and the third light-active layer. A third Bragg reflector is formed between the second light-active layer and the second tunnel junction. A fourth Bragg reflector is formed between the third light-active layer and the second tunnel junction. Advantageously, the semiconductor layer structure of this optoelectronic device comprises three light-active layers arranged stacked on top of one another, whereby the optoelectronic device may display a particularly high brightness. In this way, the optoelectronic device may be suitable as a bright point light source for example for projection applications.

A method for producing an optoelectronic device comprises steps of providing a substrate, growing a first light-active layer, growing a first Bragg reflector, growing a second Bragg reflector, and growing a second light-active layer. Advantageously, this method results in an optoelectronic device with a semiconductor layer structure which comprises two light-active layers arranged stacked on top of one another and may thereby achieve particularly high brightness. Advantageously, two Bragg reflectors are arranged between the light-active layers, which may prevent radiation emitted in the light-active layers from being absorbed in a tunnel junction of the semiconductor layer structure located between the light-active layers. This advantageously makes it possible to prevent absorption-related losses in brightness and efficiency of the optoelectronic device.

In one embodiment of the method, the latter comprises further steps of growing a third Bragg reflector, growing a fourth Bragg reflector, and growing a third light-active layer. Advantageously, the semiconductor layer structure of the optoelectronic device obtainable by this method comprises three light-active layers arranged stacked on top of one another, whereby a particularly bright point light source is obtainable.

BRIEF DESCRIPTION OF THE DRAWINGS

The above-described characteristics, features and advantages of these devices and methods described here and the manner in which these may be achieved will become still clearer and more distinctly comprehensible from the following description of the exemplary embodiments, which are explained in greater detail in connection with the drawings. In the figures, in each case in schematic representation FIG. 1 shows a semiconductor layer structure with two light-active layers arranged stacked on top of one another; and FIG. 2 shows a semiconductor layer structure with three light-active layers arranged stacked on top of one another.

DETAILED DESCRIPTION OF THE DRAWINGS

FIG. 1 shows a highly schematic and simplified sectional representation of a first semiconductor layer structure 100 of a first optoelectronic device 10. Not all the layers of the first semiconductor layer structure 100 are illustrated. Moreover, for the sake of greater clarity the thicknesses of the individual layers of the first semiconductor layer structure 100 are not illustrated in a thickness ratio which is true to scale.

The first optoelectronic device 10 may for example be a light-emitting diode (LED) device, which emits electromagnetic radiation (light) in the visible spectral range. In this case, the first semiconductor layer structure 100 of the first optoelectronic device 10 may be based for example on a group-III nitride-material system, for example an InGaN material system, or a group-III phosphide material system, for example an InGaAlP material system.

The first semiconductor layer structure 100 may be produced by epitaxial growth. Growth here proceeds in a growth direction 101. The individual layers of the first semiconductor layer structure 100 are oriented perpendicular to the growth direction bearing reference numeral 101.

The first semiconductor layer structure 100 comprises a substrate 120. The substrate 120 is optically transparent. The substrate 120 may comprise sapphire, zinc oxide or glass, for example. The first semiconductor layer structure 100 may during its production have been grown directly on the substrate 120. The first semiconductor layer structure 100 may however also have been grown on another substrate. In this case, the other substrate was replaced after growth of the first semiconductor layer structure 100 by the substrate 120.

Above the substrate 120 in growth direction 101 a first n-doped layer 130, a first light-active layer 140 and a first p-doped layer 150 succeed one another, jointly forming a first light-emitting diode structure of the first semiconductor layer structure 100. In the region of the first light-active layer 140 a pn junction is formed. If current flows through the pn junction of the first light-active layer 140 in the conducting direction, electromagnetic radiation, preferably visible light, is emitted in the first light-active layer 140. The first light-active layer 140 preferably comprises one or more quantum films.

Above the first p-doped layer 150, i.e. following the first p-doped layer 150 in growth direction 101, there is arranged a first Bragg reflector 160. The first Bragg reflector 160 may also be known as a distributed Bragg reflector (DBR). The first Bragg reflector 160 comprises a plurality of first layers 161 and second layers 162, which succeed one another in each case alternately in growth direction 101. All the first layers 161 of the first Bragg reflector 160 comprise a first material 163. All the second layers 162 of the first Bragg reflector 160 comprise a second material 164. If the first semiconductor layer structure 100 is formed from an InGaAlP material system, the first material 163 may for example comprise InAlP, while the second material 164 comprises InGaAlP. The first material 163 may also comprise InGaAlP with a high aluminum content of for example 70% to 80%. The first material 163 and the second material 164 may also be formed by AlGaAs with proportions of Al to Ga such as 50:50 and 95:5. If the first semiconductor layer structure 100 comprises an InGaN material system, the first material 163 may for example comprise AlInN, while the second material 164 comprises GaN. In any event, the first layers 161 of the first Bragg reflector 160 have a different refractive index from the second layers 162.

Electromagnetic radiation may be emitted in the first light-active layer 140 in several or all spatial directions. Electromagnetic radiation emitted in the opposite direction to the growth direction 101 may enter the transparent substrate 120 and leave it through side faces 121 of the substrate 120 oriented parallel to the growth direction 101. The substrate 120 thereby acts as a volume emitter. A back surface reflector 110 may be arranged at a bottom surface 122 of the substrate 120 oriented contrary to the growth direction 101. Electromagnetic radiation is then reflected back into the substrate 120 at the surface 122 of the substrate 120 by the back surface reflector 110, so as then to leave the substrate 120 through one of the side faces 121. The back surface reflector 110 may take the form, for example, of a metal coating. At the surface 122 of the substrate 120 it is further possible to provide an outcoupling structure 123. In the region of the outcoupling structure 123 the surface 122 of the substrate 120 may be roughened or otherwise patterned. In this way, electromagnetic radiation reflected at the back surface reflector 110 may be scattered in different spatial directions, to increase the probability of the reflected electromagnetic radiation then leaving the substrate 120 through one of the side faces 121. The outcoupling structure 123 may however also be omitted.

Electromagnetic radiation which is emitted from the first light-active layer 140 in the direction of the first Bragg reflector 160 is reflected at the first Bragg reflector 160. The first Bragg reflector 160 is to this end tuned to the wavelength of the electromagnetic radiation emitted by the first light-active layer 140. Electromagnetic radiation reflected at the first Bragg reflector 160 may in turn subsequently leave the first semiconductor layer structure through the side faces 121 of the substrate 120. Electromagnetic radiation reflected at the first Bragg reflector 160 may also be reabsorbed in the first light-active layer 140, a process which may be designated photon recycling.

The first layers 161, comprising the first material 163, of the first Bragg reflector 160 each have a first optical thickness 165 in the growth direction 101. The second layers 162, comprising the second material 164, of the first Bragg reflector 160 each have a second optical thickness 166 in the growth direction 101. Each adjacent pair of a first layer 161 comprising the first material 163 and a second layer 162 comprising the second material 164 of the first Bragg reflector 160 jointly has an optical thickness in the growth direction 101 which corresponds to at least approximately half the wavelength of the electromagnetic radiation emitted by the first light-active layer 140. An optical thickness of a pair of first layer 161 and second layer 162 of less than half the wavelength of the electromagnetic radiation emitted by the first light-active layer 140 would lead to an ineffective first Bragg reflector 160. The first optical thickness 165 and the second optical thickness 166 are preferably in each case at least as great as a quarter of the wavelength of the electromagnetic radiation emitted by the first light-active layer 140.

The first Bragg reflector 160 is preferably configured such that electromagnetic radiation not impinging precisely perpendicularly on the first Bragg reflector 160 is reflected with high reflectivity by the first Bragg reflector 160. Preferably, the first Bragg reflector 160 should reflect all radiation which impinges on the first Bragg reflector 160 at an angle which is smaller than the critical angle of total reflection. This critical angle may amount for example to approximately 70°.

An individual pair of a first layer 161 comprising the first material 163 and a second layer 162 comprising the second material 164 of the first Bragg reflector 160 is capable of reflecting electromagnetic radiation from a wavelength interval whose breadth corresponds to an angular variation of the radiation impinging on the first Bragg reflector 160 of for example 10°. If successive pairs of first layers 161 comprising the first material 163 and second layers 162 comprising the second material 164 of the first Bragg reflector 160 are tuned by increasing optical thicknesses 165, 166 in each case to adjacent or overlapping wavelength intervals with increasing average wavelengths, each of these layer pairs is in a position to reflect radiation which impinges on the first Bragg reflector 160 at an angle from an in each case fixed angular range. These angular ranges covered by the individual layer pairs may add up to a desired total coverage angle of for example +/−70°.

The first Bragg reflector 160 is p-doped, like the first p-doped layer 150. Above the first Bragg reflector 160 in growth direction 101 the first semiconductor layer structure 100 comprises a second Bragg reflector 260. The second Bragg reflector 260 is n-doped. A first tunnel junction 200 is arranged between the first Bragg reflector 160 and the second Bragg reflector 260. In the region of the first tunnel junction 200 p-doping and n-doping meet, resulting in a pn junction with a polarity which is the reverse of the pn junction of the first light-active layer 140 and thus in a tunnel barrier.

The first tunnel junction 200 preferably comprises a small band gap and a high charge carrier density. When the AlInGaN material system is used, a small band gap of the first tunnel junction 200 may be achieved, for example through an indium content of the first tunnel junction 200 of over 35%. A high charge carrier density of the first tunnel junction 200 may be achieved by high doping in the region of the first tunnel junction 200. The first tunnel junction 200 preferably comprises a p+-doped region 201 and an n+-doped region 203 in succession in growth direction 101. The p+-doped region 201 in this case adjoins the first Bragg reflector 160. The n+-doped region 203 adjoins the second Bragg reflector 260. The p+-doped region 201 is preferably more strongly p-doped than the first Bragg reflector 160 and the first p-doped layer 150. The p+-doped region 201 is preferably doped with a degree of doping of at least 10^20 per cubic centimeter. The n+-doped region 203 is more strongly n-doped than the second Bragg reflector 260. The n+-doped region 203 is preferably n-doped with a degree of doping of at least 10^20 per cubic centimeter.

Between the p+-doped region 201 of the first tunnel junction 200 and the n+-doped region 203 of the first tunnel junction 200 it is additionally possible to arrange a spacer layer 202, which is nominally undoped. The spacer layer 202 serves to prevent diffusion of the p-dopant of the p+-doped region 201 into the n+-doped region 203. Through diffusion of the p-dopant, the spacer layer 202 may comprise a certain p-doping.

If the first tunnel junction 200 is configured, as described, with a small band gap and a high charge carrier density, the first tunnel junction 200 has favorable electrical properties. When the first optoelectronic device 10 is in operation, there is only a small voltage drop over the first tunnel junction 200 and hence only a small increase in the operating voltage needed to operate the first optoelectronic device 10.

A high indium concentration and a high charge carrier density in the region of the first tunnel junction 200 however also results in electromagnetic radiation penetrating into the first tunnel junction 200 being effectively absorbed in the region of the first tunnel junction 200. To avoid such absorption losses in the first tunnel junction 200, the first tunnel junction 200 is shielded optically from the first light-active layer 140 by the first Bragg reflector 160. Electromagnetic radiation emitted by the first light-active layer 140 is reflected at the first Bragg reflector 160 and cannot thereby reach the first tunnel junction 200.

Above the second Bragg reflector 260 in growth direction 101 the first semiconductor layer structure 100 comprises a second n-doped layer 250, a second light-active layer 240 and a second p-doped layer 230. The second n-doped layer 250 here adjoins the second Bragg reflector 260. Together the second n-doped layer 250, the second light-active layer 240 and the second p-doped layer 230 form a second light-emitting diode structure of the first semiconductor layer structure 100.

The second light-active layer 240 is provided for the purpose of emitting electromagnetic radiation, preferably visible light, when the first optoelectronic device 10 is in operation. The wavelength of the electromagnetic radiation emitted by the second light-active layer 240 may correspond to the wavelength of the electromagnetic radiation emitted by the first light-active layer 140 or be another wavelength. If the light-active layers 140, 240 emit electromagnetic radiation of different wavelengths, the first optoelectronic device 10 forms a monolithic mixed light emitter with the first semiconductor layer structure 100.

Electromagnetic radiation which is emitted from the second light-active layer 240 in growth direction 101 may leave the first semiconductor layer structure 100 through a surface 102 of the first semiconductor layer structure 100 pointing in the growth direction 101. The surface 102 may for example be formed by a surface of the second p-doped layer 230 or a surface of a further layer of the first semiconductor layer structure 100 following the second p-doped layer 230 in growth direction 101. The second light-emitting diode structure, comprising the second light-active layer 240, of the first semiconductor layer structure 100 thereby acts as a surface emitter. At the surface 102 an outcoupling structure 103 in the form of roughening or other patterning may additionally be provided, to prevent total reflection at the surface 102 and thereby to assist in outcoupling of the electromagnetic radiation through the surface 102.

Electromagnetic radiation which is emitted from the second light-active layer 240 in the direction of the second Bragg reflector 260 is reflected by the second Bragg reflector 260 in the direction of the second light-active layer 240. To this end, the second Bragg reflector 260 comprises a plurality of first layers 261 and second layers 262 which are arranged alternately relative to one another. The first layers 261 and the second layers 262 of the second Bragg reflector 260 may be configured like the layers 161, 162 of the first Bragg reflector 160. The optical thicknesses of the layers 261, 262 of the second Bragg reflector 260 are however dimensioned such that the second Bragg reflector 260 is adapted to the wavelength of the electromagnetic radiation emitted by the second light-active layer 240. Radiation emitted from the second light-active layer 240 in the direction of the second Bragg reflector 260 is reflected back to the second light-active layer 240 by the second Bragg reflector 260, so as to be reabsorbed there or subsequently to exit through the surface 102 of the first semiconductor layer structure 100. This prevents absorption in the first tunnel junction 200 of the radiation emitted by the second light-active layer 240.

FIG. 2 is a schematic sectional representation of a second semiconductor layer structure 1100 of a second optoelectronic device 1010 according to a second embodiment. The second optoelectronic device 1010 may also for example be a light-emitting diode device for emitting electromagnetic radiation in a visible wavelength range. The second semiconductor layer structure 1100 is not shown to scale in FIG. 2.

The second semiconductor layer structure 1100 corresponds in some ways to the first semiconductor layer structure 100 of the first optoelectronic device 10. Layers of the second semiconductor layer structure 1100 also present in the first semiconductor layer structure 100 are provided in FIG. 2 with the same reference numerals as in FIG. 1. In a growth direction 1101 of the second semiconductor layer structure 1100 the second semiconductor layer structure 1100 comprises in succession a substrate 120, a first n-doped layer 130, a first light-active layer 140, a first p-doped layer 150, a first Bragg reflector 160, a first tunnel junction 200, a second Bragg reflector 260, a second n-doped layer 250, a second light-active layer 240 and a second p-doped layer 230. A surface 122 of the substrate 120 oriented in the opposite direction to the growth direction 1101 comprises a back surface reflector 110. The structure and function of the stated layers correspond to those of the corresponding layers of the first semiconductor layer structure 100 of the first optoelectronic device 10 of FIG. 1.

In the second semiconductor layer structure 1100 of the second optoelectronic device 1010 a third Bragg reflector 310 follows the second p-doped layer 230 in growth direction 1101. The third Bragg reflector 310 adjoins the second p-doped layer 230 and, like this, is p-doped. The third Bragg reflector 310 comprises a plurality of first layers 311 and second layers 312, which in each case succeed one another alternately. The first layers 311 and the second layers 312 of the third Bragg reflector 310 may be configured like the first layers 261 and the second layers 262 of the second Bragg reflector 260. The third Bragg reflector 310 is provided to reflect back in the direction of the second light-active layer 240 electromagnetic radiation emitted from the second light-active layer 240 towards the third Bragg reflector 310 in growth direction 1101.

Electromagnetic radiation generated in the second light-active layer 240 may thereby leave the second semiconductor layer structure 1100 only via side faces 241 of the second light-active layer 240 oriented parallel to the growth direction 1101 and optionally also via side faces of the second n-doped layer 250 and second p-doped layer 230 oriented parallel to the growth direction 1101. The second light-emitting diode structure, comprising the second light-active layer 240, of the second semiconductor layer structure 1100 thereby acts as an edge emitter.

A fourth Bragg reflector 320 is arranged above the third Bragg reflector 310 in growth direction 1101. The fourth Bragg reflector 320 is n-doped. A second tunnel junction 300 is formed between the p-doped third Bragg reflector 310 and the n-doped fourth Bragg reflector 320. The second tunnel junction 300 corresponds in structure and mode of operation to the first tunnel junction 200. Thus, the second tunnel junction 300 also preferably comprises in growth direction 1101 a p+-doped region 301, a spacer layer 302 and an n+-doped region 303. The p+-doped region 301 adjoins the third Bragg reflector 310 and is p-doped with a higher degree of doping than the third Bragg reflector 310. The n+-doped region 303 adjoins the fourth Bragg reflector 320 and is n-doped with a higher degree of doping than the fourth Bragg reflector 320. The spacer layer 302 is nominally undoped.

Above the fourth Bragg reflector 320 in growth direction 1101 a third n-doped layer 330, a third light-active layer 340 and a third p-doped layer 350 succeed one another, forming a third light-emitting diode structure of the second semiconductor layer structure 1100. The third n-doped layer 330 adjoins the fourth Bragg reflector 320. When the second optoelectronic device 1010 is in operation, the third light-active layer 340 emits electromagnetic radiation with a wavelength which is preferably in the visible spectral range. The wavelength of the electromagnetic radiation generated in the third light-active layer 340 may correspond to the wavelength of the electromagnetic radiation generated in the first light-active layer 140 and/or the wavelength of the electromagnetic radiation generated in the second light-active layer 240, or indeed differ from these wavelengths.

Electromagnetic radiation emitted from the third light-active layer 340 towards the fourth Bragg reflector 320 in the opposite direction from the growth direction 1101 is reflected by the fourth Bragg reflector 320 so as to prevent absorption in the second tunnel junction 300 of the electromagnetic radiation generated in the third light-active layer 340. To this end, the fourth Bragg reflector 320 comprises a plurality of first layers 321 and second layers 322, the optical thicknesses of which are tuned to the wavelength of the electromagnetic radiation generated in the third light-active layer 340. Otherwise, the structure of the fourth Bragg reflector 320 corresponds to that of the other Bragg reflectors 160, 260, 310.

Electromagnetic radiation which leaves the third light-active layer 340 in growth direction 1101, and electromagnetic radiation which is reflected in growth direction 1101 at the fourth Bragg reflector 320 may leave the second semiconductor layer structure 1100 at a surface 1102 oriented in growth direction 1101. The surface 1102 of the second semiconductor layer structure 1100 may be formed by a surface of the third p-doped layer 350 or a surface of a further layer of the second semiconductor layer structure 1100 following the third p-doped layer 350 in growth direction 1101. The surface 1102 of the second semiconductor layer structure 1100 may be provided with an outcoupling structure 1103 in the form of roughening or other patterning, to prevent total reflection at the surface 1102 and to simplify outcoupling of electromagnetic radiation through the surface 1102.

It goes without saying that the basic structure explained with reference to FIGS. 1 and 2 may be extended to optoelectronic devices with semiconductor layer structures which have more than three light-active layers. In this case, a tunnel junction is always formed between light-active layers succeeding one another in the growth direction, which tunnel junction is shielded from the light-active layers by Bragg reflectors arranged on both sides to prevent electromagnetic radiation from being absorbed in the tunnel junction.

The doping of the first semiconductor layer structure 100 and the second semiconductor layer structure 1100 explained by way of example may also be configured with reverse polarity. In such a case, every instance of p-doping is replaced by n-doping and every instance of n-doping is replaced by p-doping. Thus, instead of the first n-doped layer 130 a p-doped layer is then for example present and instead of the first p-doped layer 150 an n-doped layer.

The invention has been illustrated and described in greater detail with reference to the preferred exemplary embodiments. The invention is nevertheless not restricted to the disclosed examples. Rather, other variations may be derived therefrom by a person skilled in the art without going beyond the scope of protection of the invention.

The invention claimed is:

1. An optoelectronic device having a semiconductor layer structure comprising:
    a substrate;
    a first light-active layer and a second light-active layer,
    wherein a first tunnel junction is formed between the first light-active layer and the second light-active layer,
    wherein a first Bragg reflector is formed between the first light-active layer and the first tunnel junction, and
    wherein a second Bragg reflector is formed between the second light-active layer and the first tunnel junction;
    wherein at least a portion of an electromagnetic radiation emitted by the first light-active layer leaves the optoelectronic device via the substrate,
    wherein the optoelectronic device is a light emitting diode, and
    wherein at least a portion of the electromagnetic radiation emitted in the semiconductor layer structure leaves the optoelectronic device through a surface of the semiconductor layer structure that faces away from the substrate.

2. The optoelectronic device according to claim 1,
    wherein the first Bragg reflector is configured to reflect electromagnetic radiation from the first light-active layer which impinges on the first Bragg reflector.

3. The optoelectronic device according to claim 2,
    wherein the first light-active layer is configured to emit electromagnetic radiation with a wavelength from a first wavelength interval, wherein the first Bragg reflector is configured to reflect electromagnetic radiation with a wavelength from the first wavelength interval.

4. The optoelectronic device according to claim 3,
    wherein the first Bragg reflector comprises a plurality of alternating first layers, which comprise a first material, and second layers, which comprise a second material.

5. The optoelectronic device according to claim 4,
    wherein each pair of a first layer and an adjacent second layer together comprises an optical thickness which is at least as great as half a wavelength of electromagnetic radiation emitted by the first light-active layer.

6. The optoelectronic device according to claim 4,
    wherein the first material and the second material have different refractive indices.

7. The optoelectronic device according to claim 4,
    wherein the first material and the second material are group-III phosphides.

8. The optoelectronic device according to claim 4,
    wherein the first material and the second material are group-III nitrides.

9. The optoelectronic device according to claim 1,
    wherein the first Bragg reflector is n-doped and the second Bragg reflector is p-doped, or the first Bragg reflector is p-doped and the second Bragg reflector is n-doped.

10. The optoelectronic device according to claim 1,
    wherein the second Bragg reflector is configured to reflect electromagnetic radiation from the second light-active layer which impinges on the second Bragg reflector.

11. The optoelectronic device according to claim 1,
    wherein the first tunnel junction comprises a p-doped region with a degree of doping of at least $10^{20}$ per cubic centimeter and an n-doped region with a degree of doping of at least 10^20 per cubic centimeter.

12. The optoelectronic device according to claim 11,
wherein a spacer layer is arranged between the p-doped region of the first tunnel junction and the n-doped region of the first tunnel junction,
wherein the spacer layer has a lower degree of doping than the p-doped region of the first tunnel junction and is preferably undoped.

13. The optoelectronic device according to claim 1,
wherein the first light-active layer takes the form of a quantum film structure.

14. The optoelectronic device according to claim 1,
wherein the semiconductor layer structure comprises a third light-active layer,
wherein a second tunnel junction is arranged between the second light-active layer and the third light-active layer,
wherein a third Bragg reflector is formed between the second light-active layer and the second tunnel junction,
wherein a fourth Bragg reflector is formed between the third light-active layer and the second tunnel junction.

15. The optoelectronic device according to claim 1,
wherein the first Bragg reflector is nontransparent for electromagnetic radiation emitted in the first light-active layer.

16. The optoelectronic device according to claim 1,
wherein the second Bragg reflector is nontransparent for electromagnetic radiation emitted in the second light-active layer.

17. The optoelectronic device according to claim 16,
wherein in the first tunnel junction an absorption of the electromagnetic radiation, which is emitted in the first and second light-active layers, is prevented by the reflection of the electromagnetic radiation at the first Bragg reflector and the second Bragg reflector.

* * * * *